(12) United States Patent
Lu et al.

(10) Patent No.: US 11,164,756 B2
(45) Date of Patent: Nov. 2, 2021

(54) SEMICONDUCTOR DEVICE PACKAGE HAVING CONTINOUSLY FORMED TAPERED PROTRUSIONS

(71) Applicant: Advanced Semiconductor Engineering, Inc., Kaohsiung (TW)

(72) Inventors: Ying-Xu Lu, Kaohsiung (TW); Tang-Yuan Chen, Kaohsiung (TW); Jin-Yuan Lai, Kaohsiung (TW); Tse-Chuan Chou, Kaohsiung (TW); Meng-Kai Shih, Kaohsiung (TW); Shin-Luh Tarng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/813,364

(22) Filed: Mar. 9, 2020

(65) Prior Publication Data
US 2020/0211863 A1 Jul. 2, 2020

Related U.S. Application Data

(63) Continuation of application No. 15/619,413, filed on Jun. 9, 2017, now Pat. No. 10,586,716.

(51) Int. Cl.
*H01L 23/13* (2006.01)
*H01L 23/49* (2006.01)
(Continued)

(52) U.S. Cl.
CPC ............ *H01L 21/563* (2013.01); *H01L 23/13* (2013.01); *H01L 23/49838* (2013.01);
(Continued)

(58) Field of Classification Search
CPC ... H01L 23/13; H01L 23/49838; H01L 24/32; H01L 24/83; H01L 2224/83051
See application file for complete search history.

(56) References Cited

U.S. PATENT DOCUMENTS

| 5,766,982 A | 6/1998 | Akram et al. |
| 6,048,656 A * | 4/2000 | Akram ............... H01L 21/563 |
| | | 257/787 |

(Continued)

FOREIGN PATENT DOCUMENTS

| JP | 2000340715 A | * 12/2000 | ............ H01L 24/32 |
| JP | 2006303216 A | * 11/2006 | ............ H01L 24/32 |

(Continued)

OTHER PUBLICATIONS

Final Office Action on U.S. Appl. No. 15/619,413, dated Jun. 5, 2018, 10 pages.

(Continued)

*Primary Examiner* — Ida M Soward
(74) *Attorney, Agent, or Firm* — Foley & Lardner LLP

(57) ABSTRACT

The present disclosure relates to a semiconductor device package including a substrate, a semiconductor device and an underfill. The substrate has a first surface and a second surface angled with respect to the first surface. The semiconductor device is mounted on the first surface of the substrate and has a first surface facing the first surface of the substrate and a second surface angled with respect to the first surface of the substrate. The underfill is disposed between the first surface of the semiconductor device and the first surface of the substrate. The second surface of the substrate is located in the substrate and external to a vertical projection of the semiconductor device on the first surface of the substrate. A distance between the second surface of the substrate and an extension of the second surface of the semiconductor device on the first surface of the substrate is (Continued)

less than or equal to twice a distance between the first surface of the semiconductor device and the first surface of the substrate. The second surface of the substrate extends along at least three sides of the semiconductor device.

18 Claims, 12 Drawing Sheets

(51) Int. Cl.
  *H01L 21/56* (2006.01)
  *H01L 23/498* (2006.01)
  *H01L 23/00* (2006.01)
(52) U.S. Cl.
  CPC .............. *H01L 24/32* (2013.01); *H01L 24/83* (2013.01); *H01L 24/16* (2013.01); *H01L 24/73* (2013.01); *H01L 24/81* (2013.01); *H01L 24/92* (2013.01); *H01L 2224/13101* (2013.01); *H01L 2224/16225* (2013.01); *H01L 2224/16227* (2013.01); *H01L 2224/26175* (2013.01); *H01L 2224/32225* (2013.01); *H01L 2224/73204* (2013.01); *H01L 2224/81815* (2013.01); *H01L 2224/8314* (2013.01); *H01L 2224/92125* (2013.01); *H01L 2924/1515* (2013.01); *H01L 2924/15159* (2013.01)

(56) References Cited

U.S. PATENT DOCUMENTS

| | | | |
|---|---|---|---|
| 6,131,278 A * | 10/2000 | MacQuarrie | H01L 21/563 174/538 |
| 6,239,484 B1 | 5/2001 | Dore et al. | |
| 6,291,264 B1 * | 9/2001 | Tang | H01L 24/28 438/106 |
| 6,294,840 B1 * | 9/2001 | McCormick | H01L 21/563 174/260 |
| 6,313,521 B1 | 11/2001 | Baba | |
| 6,391,682 B1 * | 5/2002 | Tsai | H01L 21/563 257/E21.503 |
| 6,400,033 B1 | 6/2002 | Darveaux | |
| 6,400,036 B1 | 6/2002 | Tang et al. | |
| 6,498,054 B1 * | 12/2002 | Chiu | H01L 21/563 257/778 |
| 6,555,924 B2 | 4/2003 | Chai et al. | |
| 6,614,122 B1 | 9/2003 | Dory et al. | |
| 6,710,458 B2 * | 3/2004 | Seko | H01L 21/563 257/668 |
| 6,803,646 B2 * | 10/2004 | Shibue | H01L 23/3135 257/667 |
| 6,940,182 B2 * | 9/2005 | Hilton | H01L 21/563 257/787 |
| 6,946,741 B2 | 9/2005 | Yamashita | |
| 6,984,286 B2 * | 1/2006 | Bonitz | H01L 21/4882 156/275.5 |
| 7,053,494 B2 * | 5/2006 | Seko | H01L 24/16 257/784 |
| 7,122,893 B2 | 10/2006 | Weng et al. | |
| 8,067,306 B2 | 11/2011 | Yang et al. | |
| 8,288,177 B2 | 10/2012 | Gaynes et al. | |
| 8,350,383 B2 | 1/2013 | Daubenspeck et al. | |
| 8,389,339 B2 | 3/2013 | Tanuma et al. | |
| 8,399,300 B2 | 3/2013 | Lee et al. | |
| 8,432,025 B2 * | 4/2013 | Saeki | H01L 23/3157 257/678 |
| 8,476,115 B2 * | 7/2013 | Choi | H01L 21/56 438/118 |
| 8,531,025 B2 * | 9/2013 | Edwards | H01L 23/42 257/712 |
| 8,633,598 B1 | 1/2014 | St. Amand | |
| 8,673,684 B2 | 3/2014 | Ihara | |
| 8,693,211 B2 * | 4/2014 | Tamadate | H01L 21/563 361/777 |
| 8,735,819 B2 | 5/2014 | Fendler et al. | |
| 8,802,496 B2 | 8/2014 | Shibuya et al. | |
| 8,803,323 B2 | 8/2014 | Yu et al. | |
| 8,815,650 B2 | 8/2014 | Pagaila | |
| 8,952,552 B2 | 2/2015 | Zang et al. | |
| 9,030,030 B2 * | 5/2015 | Lee | H01L 23/3121 257/783 |
| 9,142,526 B2 | 9/2015 | Lin et al. | |
| 9,314,882 B2 * | 4/2016 | Babiarz | H01L 24/27 |
| 9,391,012 B2 * | 7/2016 | Wu | H01L 25/0657 |
| 9,496,154 B2 | 11/2016 | Tosaya et al. | |
| 9,497,861 B2 | 11/2016 | Lu et al. | |
| 9,520,352 B2 | 12/2016 | Arisaka et al. | |
| 9,589,875 B2 | 3/2017 | Wang et al. | |
| 9,596,756 B2 | 3/2017 | Rainer et al. | |
| 9,613,888 B2 | 4/2017 | Yoneyama et al. | |
| 9,842,788 B2 | 12/2017 | Chen et al. | |
| 10,008,427 B2 * | 6/2018 | Davis | H01L 21/563 |
| 10,522,437 B2 * | 12/2019 | Lu | H01L 21/481 |
| 2005/0046008 A1 * | 3/2005 | Gai | H01L 23/3107 257/690 |
| 2005/0051885 A1 | 3/2005 | Weng et al. | |
| 2006/0046352 A1 | 3/2006 | Low et al. | |
| 2007/0246823 A1 | 10/2007 | Haga et al. | |
| 2008/0203564 A1 * | 8/2008 | Motoyoshi | H01L 24/32 257/737 |
| 2009/0039495 A1 * | 2/2009 | Yamashita | H01L 24/28 257/690 |
| 2009/0166826 A1 * | 7/2009 | Janducayan | H01L 24/32 257/676 |
| 2009/0236127 A1 | 9/2009 | Kobae | |
| 2009/0294162 A1 | 12/2009 | Jeong et al. | |
| 2010/0061056 A1 | 3/2010 | Searls et al. | |
| 2010/0139962 A1 | 6/2010 | Kaneko | |
| 2010/0304536 A1 | 12/2010 | Sumita | |
| 2011/0275177 A1 | 11/2011 | Yim et al. | |
| 2011/0304059 A1 | 12/2011 | Kobayashi et al. | |
| 2012/0068353 A1 * | 3/2012 | Huang | H01L 21/565 257/774 |
| 2013/0093075 A1 | 4/2013 | Liu et al. | |
| 2014/0027920 A1 | 1/2014 | Kodama | |
| 2014/0030855 A1 | 1/2014 | Kim et al. | |
| 2014/0061902 A1 | 3/2014 | Ramalingam et al. | |
| 2014/0185254 A1 | 7/2014 | Mok et al. | |
| 2017/0053846 A1 * | 2/2017 | Katsura | H01L 21/563 |
| 2017/0103906 A1 | 4/2017 | Han et al. | |
| 2017/0162541 A1 * | 6/2017 | Chen | H01L 24/11 |
| 2017/0179042 A1 | 6/2017 | Arvin et al. | |
| 2017/0221860 A1 | 8/2017 | Chou | |
| 2018/0190575 A1 | 7/2018 | Rodriguez et al. | |

FOREIGN PATENT DOCUMENTS

| | | |
|---|---|---|
| KR | 691443 B1 | 3/2007 |
| TW | 200428615 B | 11/2004 |
| TW | 200941675 A | 10/2009 |

OTHER PUBLICATIONS

Final Office Action on U.S. Appl. No. 15/619,413, dated Mar. 11, 2019, 9 pages.
Non-Final Office Action on U.S. Appl. No. 15/619,413, dated Aug. 31, 2018, 10 pages.
Non-Final Office Action on U.S. Appl. No. 15/619,413, dated Jan. 18, 2018, 12 pages.
Non-Final Office Action on U.S. Appl. No. 15/619,413, dated May 28, 2019, 9 pages.
Notice of Allowance on U.S. Appl. No. 15/619,413, dated Nov. 1, 2019, 9 pages.

* cited by examiner

SEMICONDUCTOR DEVICE PACKAGE HAVING CONTINUOUSLY FORMED TAPERED PROTRUSIONS

CROSS-REFERENCE TO RELATED APPLICATION

This application is a continuation of U.S. patent application Ser. No. 15/619,413 filed Jun. 9, 2017, the contents of which is incorporated herein by reference in its entirety.

BACKGROUND

1. Technical Field

The present disclosure relates to a semiconductor device package.

2. Description of the Related Art

In the past few years, as electronic products are developed toward being thin and small, multi-functioned, and high-speed, high-density and high input/output semiconductor package structures are increasingly used. For this reason, a flip chip package structure is now widely applied in high-performance products and portable electronic products.

Regarding the flip chip package structure, a semiconductor device (e.g., a flip chip type die) includes multiple solder bumps at its active surface and a substrate includes multiple solder pads. The solder bumps of the semiconductor device are bonded to the solder pads of the substrate by reflow soldering such that the semiconductor device is mounted to a substrate and electrically connected to a conductive pattern of the substrate. Further, an underfill is applied or disposed under the semiconductor device or between the semiconductor device and substrate so as to tightly join the semiconductor device and the substrate. However, in the underfill process, the underfill may bleed or overflow to another area (which has, for example, other conductive structures such as pads, traces, etc.) on the substrate and cause undesired issues.

SUMMARY

According to some embodiments of the instant disclosure, a semiconductor device package includes a substrate, a semiconductor device and an underfill. The substrate has a first surface and a second surface angled (e.g., substantially perpendicular at an angle of about 90 degrees or at another non-zero angle) with respect to the first surface. The semiconductor device is mounted on the first surface of the substrate and has a first surface facing the first surface of the substrate and a second surface angled (e.g., substantially perpendicular at an angle of about 90 degrees or at another non-zero angle) with respect to the first surface of the substrate. The underfill is disposed between the first surface of the semiconductor device and the first surface of the substrate. The second surface of the substrate is located in the substrate and external to a vertical projection of the semiconductor device on the first surface of the substrate. A distance between the second surface of the substrate and an extension of the second surface of the semiconductor device on the first surface of the substrate is less than or equal to about twice a distance between the first surface of the semiconductor device and the first surface of the substrate. The second surface of the substrate extends along at least three sides of the semiconductor device.

According to some embodiments of the instant disclosure, a semiconductor device package includes a semiconductor device, a substrate and an underfill. The semiconductor device has a first surface. Further, the semiconductor device includes a first protrusion on the first surface of the semiconductor device, and the first protrusion is continuously formed along at least three edges of the first surface of the semiconductor device. The substrate has a first surface facing the first surface of the semiconductor device. The underfill is disposed between the first surface of the semiconductor device and the first surface of the substrate.

According to some embodiments of the instant disclosure, a semiconductor device package includes a semiconductor device, a substrate and an underfill. The substrate has a first surface and a mounting area on the first surface of the substrate. Further, the substrate includes a first protrusion disposed on the mounting area of the substrate, and the first protrusion is continuously formed along at least three sides of the mounting area of the substrate. The semiconductor device is disposed on the mounting area of the substrate and has a first surface facing the first surface of the substrate. The underfill is between the first surface of the semiconductor device, the first surface of the substrate and the mounting area of the substrate.

In order to further understand the instant disclosure, the following embodiments are provided along with illustrations to facilitate an appreciation of the instant disclosure; however, the appended drawings are merely provided for reference and illustration, without any intention to be used for limiting the scope of the instant disclosure.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

The aforementioned illustrations and following detailed descriptions are examples for the purpose of further explaining the scope of the instant disclosure. Other objectives and advantages related to the instant disclosure will be illustrated in the subsequent descriptions and appended drawings.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1A:
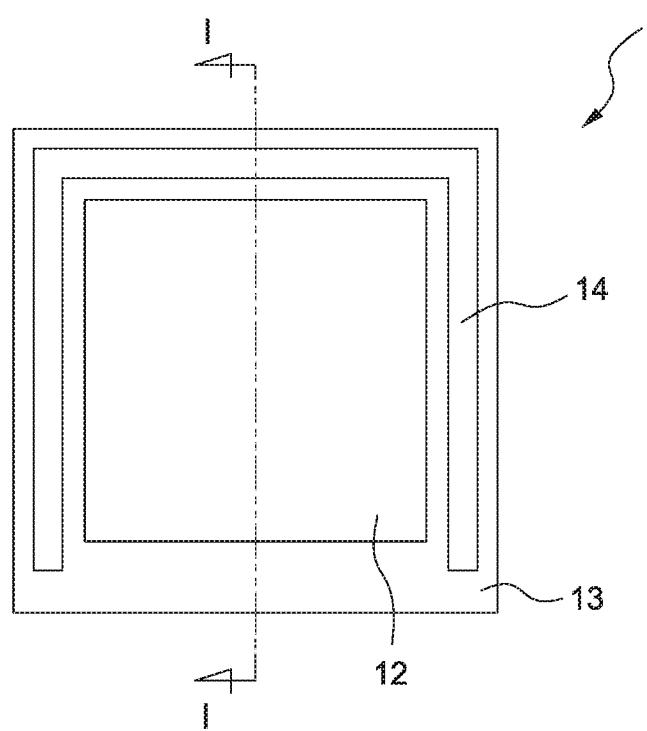
FIG. 1A is a top schematic view of a semiconductor device package in which an underfill is not filled in accordance with some embodiments of the instant disclosure.
Figure 1B:
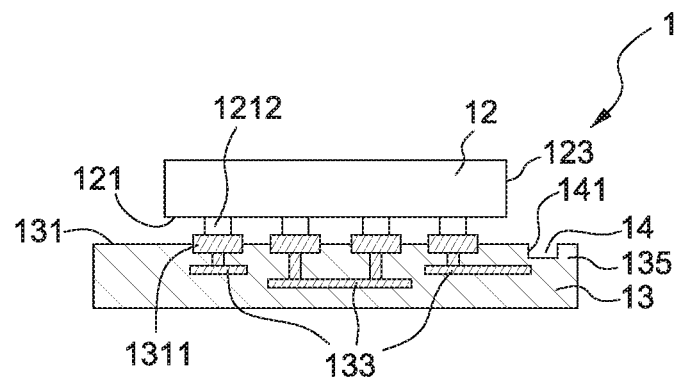
FIG. 1B is a cross-sectional view along line I-I in FIG. 1A in accordance with some embodiments of the instant disclosure.

FIGS. 1A and 1B show a semiconductor device package 1 in which an underfill is not filled in accordance with some embodiments of the instant disclosure. With reference to FIGS. 1A and 1B, the semiconductor device package 1 includes a semiconductor device 12 and a substrate 13. The semiconductor device 12 has an active surface 121, wherein multiple solder bumps 1212 are disposed on the active surface 121 of the semiconductor device 12. Further, the semiconductor device 12 has at least one side surface 123 which is substantially perpendicular to the active surface 121. The substrate 13 comprises a conductive structure 133 and a non-conductive structure 135, and the conductive structure 133 can be a conductive pattern and the non-conductive structure 135 can be a solder resist or a dielectric layer. Further, the substrate 13 includes multiple solder pads 1311 on its upper surface 131 which is facing the active surface 121 of the semiconductor device 12. The multiple solder pads 1311 are electrically connected to the conductive structure 133 of the substrate 13. The solder bumps 1212 of the semiconductor device 12 are bonded to the solder pads 1311 of the substrate 13 by a reflow soldering process such that the semiconductor device 12 is mounted to the substrate 13 and electrically connected to the conductive structure 133 of the substrate 13.

Referring to FIGS. 1A and 1B, a gap (or groove) 14 is formed on the upper surface 131 of the substrate 13 and external to a vertical projection of the semiconductor device 12 on the upper surface 131 of the substrate 13. Further, as shown in FIG. 1A, the gap 14 substantially extends along at least three sides of the semiconductor device 12. Alternatively, the gap 14 can surround the semiconductor device 12. In addition, the gap 14 can be linear or wavy. The gap 14 has a side surface 141, wherein a distance between the side surface 141 of the gap 14 and an extension of the side surface 123 of the semiconductor device 12 on the upper surface 131 of the substrate 13 is less than or equal to about twice a distance between the active surface 121 of the semiconductor device 12 and the upper surface 131 of the substrate 13. In other words, an angle between the extension of the side surface 123 of the semiconductor device 12 and a shortest line between the semiconductor device 12 and the side surface 141 of the gap 14 is less than or equal to about 63.5 degrees. In some embodiments, the distance between the side surface 141 of the gap 14 and an extension of the side surface 123 of the semiconductor device 12 on the upper surface 131 of the substrate 13 is less than about 30 micrometers (μm). In some embodiments, the distance between the side surface 141 of the gap 14 and an extension of the side surface 123 of the semiconductor device 12 on the upper surface 131 of the substrate 13 can be zero. In other words, the side surface 141 of the gap 14 and the side surface 123 of the semiconductor device 12 can be substantially coplanar or aligned. Moreover, the gap 14 is arranged in the non-conductive structure 135 of the substrate 13 and the conductive structure 133 of the substrate 13 is not exposed. In some embodiments, the gap 14 is U-shaped or rectangular-shaped.

Figure 1C:
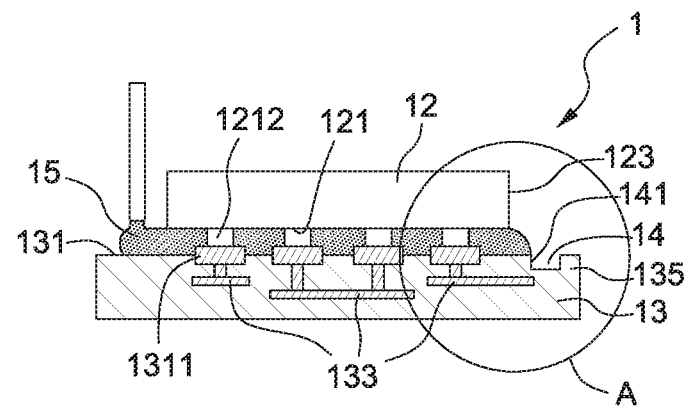
FIG. 1C is a cross-sectional view of a semiconductor device package in which a flow of an underfill is filled in accordance with some embodiments of the instant disclosure.

FIG. 1C is a cross-sectional view of a semiconductor device package 1 in which a flow of an underfill 15 is filled in accordance with some embodiments of the instant disclosure. As shown in FIG. 1C, the underfill 15 is filled between the semiconductor device 12 and the substrate 13. The underfill 15 flows into the space between the active surface 121 of the semiconductor device 12 and the upper surface 131 of the substrate 13 and then the flow of the underfill 15 stops at the gap 14 on the substrate 13. When the underfill 15 flows into the space between the active surface 121 of the semiconductor device 12 and the upper surface 131 of the substrate 13 and arrives at the gap 14, a surface tension of the underfill 15 will be formed between the side surface 123 of the semiconductor and the side surface 141 of the gap 14. Then, the surface tension can stop the flow of the underfill 15 such that the underfill 15 will not overflow and not infiltrate another area of the substrate 13.

Figure 1D:
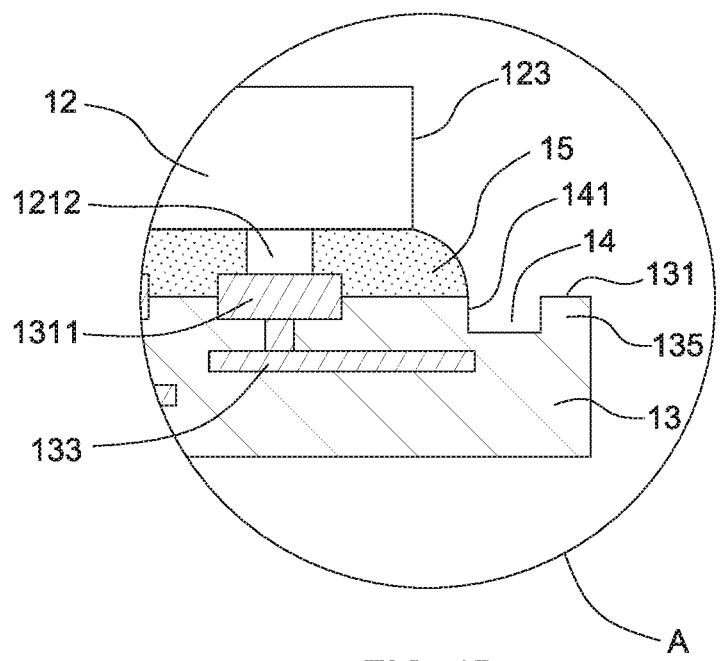
FIG. 1D is an enlarged view of portion "A" in FIG. 1C in accordance with some embodiments of the instant disclosure.

FIG. 1D is an enlarged view of portion "A" in FIG. 1C. Referring to FIG. 1D, the flow of the underfill 15 will be stopped by the surface tension of the underfill 15 formed or disposed between the side surface 123 of the semiconductor and the side surface 141 of the gap 14 when the flow of underfill 15 arrives at the gap 14. As abovementioned, in some embodiments, the distance between the side surface 141 of the gap 14 and an extension of the side surface 123 of the semiconductor device 12 on the upper surface 131 of the substrate 13 is less than or equal to about twice the distance between the active surface 121 of the semiconductor device 12 and the upper surface 131 of the substrate 13. The surface tension of the underfill 15 can be formed in such a configuration. Otherwise, if the distance between the side surface 141 of the gap 14 and an extension of the side surface 123 of the semiconductor device 12 on the upper surface 131 of the substrate 13 is larger than about twice the distance between the active surface 121 of the semiconductor device 12 and the upper surface 131 of the substrate 13, the surface tension of the underfill 15 may not be formed between the side surface 123 of the semiconductor device 12 and the side surface 141 of the gap 14 and then the underfill 15 may flow into the gap 14 and overflow to another area of the substrate 13.

Figure 2A:
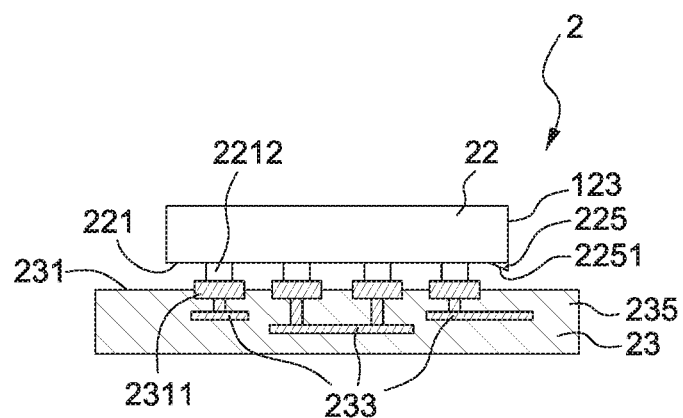
FIG. 2A is a cross-sectional view of a semiconductor device package in which an underfill is not filled in accordance with some embodiments of the instant disclosure.

FIG. 2A is a cross-sectional view of a semiconductor device package 2 in which the underfill is not filled in accordance with some embodiments of the instant disclosure. With reference to FIG. 2A, the semiconductor device package 2 includes a semiconductor device 22 and a substrate 23. The semiconductor device 22 has an active surface 221, wherein multiple solder bumps 2212 are disposed on the active surface 221 of the semiconductor device 22. The substrate 23 comprises a conductive structure 233 and a non-conductive structure 235, and the conductive structure 233 can be a conductive pattern and the non-conductive structure 235 can be a solder resist or a dielectric layer. Further, the substrate 23 includes multiple solder pads 2311 on its upper surface 231 which is facing the active surface 221 of the semiconductor device 22. The multiple solder pads 2311 are electrically connected to the conductive structure 233 of the substrate 23. The solder bumps 2212 of the semiconductor device 22 are bonded to the solder pads 2311 of the substrate 23 by a reflow soldering process such that the semiconductor device 22 is mounted to the substrate 23 and electrically connected to the conductive structure 233 of the substrate 23.

Figure 2B:
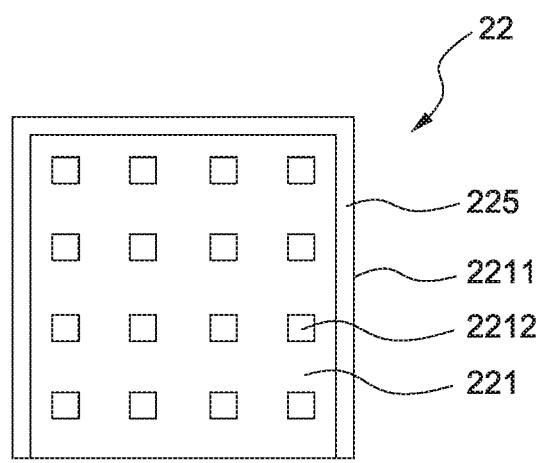
FIG. 2B is a bottom view of a semiconductor device in accordance with some embodiments of the instant disclosure.

FIG. 2B is a bottom view of the semiconductor device 22 in accordance with some embodiments of the instant disclosure. Referring to FIGS. 2A and 2B, a protrusion 225 is arranged adjacent to a periphery of the active surface 221 of the semiconductor device 22, wherein the protrusion 225 is continuously formed along at least three edges 2211 of the active surface 221 of the semiconductor device 22. In addition, the solder bumps 2212 are substantially surrounded by the protrusion 225. As shown in FIG. 2A, the protrusion 225 has an inclined top surface 2251 such that a height at the edge of the protrusion 225 proximate to the side edge 2211 of the active surface 221 of the semiconductor device 22 is larger than a height at the edge of the protrusion 225 distal from the side edge 2211 of the active surface 221 of the semiconductor device 22. Thus, the protrusion 225 has a tapered structure which is tapered in a direction moving away from the side edge 2211 of the active surface 221 of the semiconductor device 22. Further, the height at the edge of the protrusion 225 proximate to the side edge 2211 of the active surface 221 of the semiconductor device 22 is less than or equal to about half of the distance between the active surface 221 of the semiconductor device 22 and the upper surface 231 of the substrate 23.

Figure 2C:
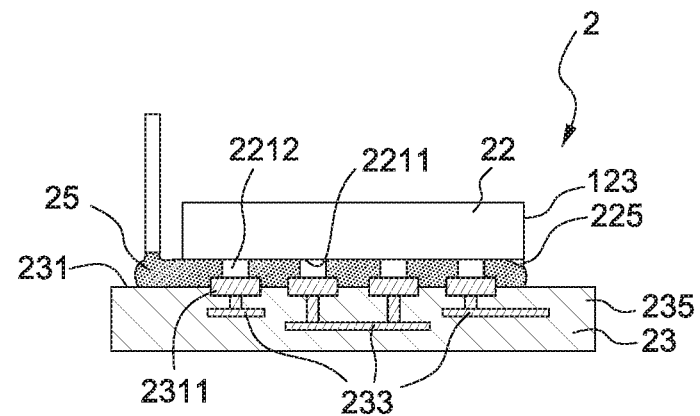
FIG. 2C is a cross-sectional view of a semiconductor device package in which a flow of an underfill is filled therein in accordance with some embodiments of the instant disclosure.

FIG. 2C is a cross-sectional view of the semiconductor device package 2 in which a flow of an underfill 25 is filled in accordance with some embodiments of the instant disclosure. As shown in FIG. 2C, the underfill 25 is filled between the semiconductor device 22 and the substrate 23. The underfill 25 flows into the space between the active surface 221 of the semiconductor device 22 and the upper surface 231 of the substrate 23 and then the flow of the underfill 25 will stop at the edge of the protrusion 225 proximate to the side edge 2211 of the active surface 221 of the semiconductor device 22. When the underfill 25 flows into the space between the active surface 221 of the semiconductor device 22 and the upper surface 231 of the substrate 23 and passes through the protrusion 225, the flow of the underfill 25 will be changed due to the tapered configuration of the protrusion 225. Further, the contact angle between the underfill 25 and the semiconductor device 22 will be changed accordingly such that the overflow of the underfill 25 can be controlled.

Figure 3A:
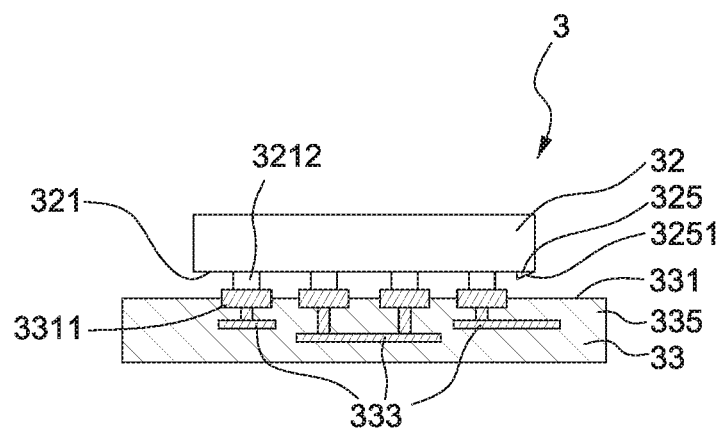
FIG. 3A is a cross-sectional view of a semiconductor device package in which an underfill is not filled in accordance with some embodiments of the instant disclosure.

FIG. 3A is a cross-sectional view of a semiconductor device package 3 in which an underfill is not filled in accordance with some embodiments of the instant disclosure. With reference to FIG. 3A, the semiconductor device package 3 includes a semiconductor device 32 and a substrate 33. The semiconductor device 32 has an active surface 321, wherein multiple solder bumps 3212 are disposed on the active surface 321 of the semiconductor device 32. The substrate 33 comprises a conductive structure 333 and a non-conductive structure 335, and the conductive structure 333 can be a conductive pattern and the non-conductive structure 335 can be a solder resist or a dielectric layer. Further, the substrate 33 includes multiple solder pads 3311 on its upper surface 331 which is facing the active surface 321 of the semiconductor device 32. The multiple solder pads 3311 are electrically connected to the conductive structure 333 of the substrate 33. The solder bumps 3212 of the semiconductor device 32 are bonded to the solder pads 3311 of the substrate 33 by a reflow soldering process such that the semiconductor device 32 is mounted to the substrate 33 and electrically connected to the conductive structure 333 of the substrate 33.

Figure 3B:
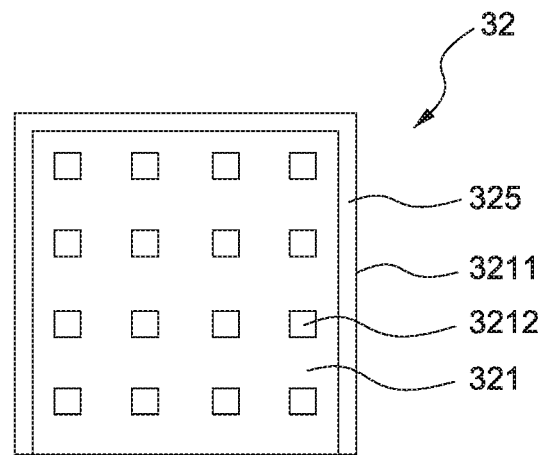
FIG. 3B is a bottom view of a semiconductor device in accordance with some embodiments of the instant disclosure.

FIG. 3B is a bottom view of the semiconductor device 32 in accordance with some embodiments of the instant disclosure. Referring to FIGS. 3A and 3B, a protrusion 325 is arranged adjacent to a periphery of the active surface 321 of the semiconductor device 32, wherein the protrusion 325 is continuously formed along at least three edges 3211 of the active surface 321 of the semiconductor device 32. In addition, the solder bumps 3212 are substantially surrounded by the protrusion 325. As shown in FIG. 3A, the protrusion 325 has an inclined top surface 3251 such that a height at the edge of the protrusion 325 proximate to the side edge 3211 of the active surface 321 of the semiconductor device 22 is smaller than a height at the edge of the protrusion 325 distal from the side edge 3211 of the active surface 321 of the semiconductor device 32. Thus, the protrusion 325 has a tapered structure which is outwardly tapered toward the side edge 3211 of the active surface 321 of the semiconductor device 32. Further, the height at the edge of the protrusion 325 distal from the side edge 3211 of the active surface 321 of the semiconductor device 32 is less than or equal to about half of the distance between the active surface 321 of the semiconductor device 32 and the upper surface 331 of the substrate 33.

Figure 3C:
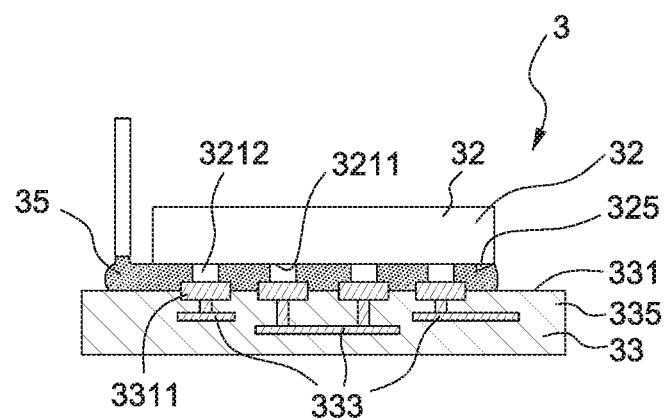
FIG. 3C is a cross-sectional view of a semiconductor device package in which a flow of an underfill is filled in accordance with some embodiments of the instant disclosure.

FIG. 3C is a cross-sectional view of a semiconductor device package 3 in which a flow of the underfill 35 is filled in accordance with some embodiments of the instant disclosure. As shown in FIG. 3C, the underfill 35 is filled between the semiconductor device 32 and the substrate 33. The underfill 35 flows into the space between the active surface 321 of the semiconductor device 32 and the upper surface 331 of the substrate 33 and then the flow of the underfill 25 will stop at the edge of the protrusion 325 proximate to the side edge 3211 of the active surface 321 of the semiconductor device 32. When the underfill 35 flows into the space between the active surface 321 of the semiconductor device 32 and the upper surface 331 of the substrate 33 and passes through the protrusion 325, the flow of the underfill 35 will be changed due to the tapered configuration of the protrusion 325. Further, the contact angle between the underfill 35 and the semiconductor device 32 will be changed accordingly such that the overflow of the underfill 35 can be controlled.

Figure 4A:
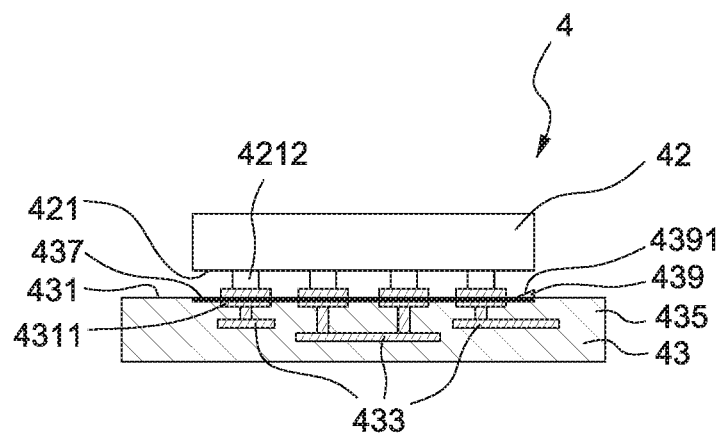
FIG. 4A is a cross-sectional view of a semiconductor device package in which an underfill is not filled in accordance with some embodiments of the instant disclosure.

FIG. 4A is a cross-sectional view of a semiconductor device package 4 in which an underfill is not filled in accordance with some embodiments of the instant disclosure. With reference to FIG. 4A, the semiconductor device package 4 includes a semiconductor device 42 and a substrate 43. The semiconductor device 42 has an active surface 421, wherein multiple solder bumps 4212 are disposed on the active surface 421 of the semiconductor device 42. The substrate 43 comprises a conductive structure 433 and a non-conductive structure 435, and the conductive structure 433 can be a conductive pattern and the non-conductive structure 435 can be a solder resist or a dielectric layer. Further, the substrate 43 has a mounting area 437 on its upper surface 431 which is facing the active surface 421 of the semiconductor device 42. Multiple solder pads 4311 are arranged on the mounting area 437 and electrically connected to the conductive structure 433 of the substrate 43. The solder bumps 4212 of the semiconductor device 42 are bonded to the solder pads 4311 of the substrate 43 by a reflow soldering process such that the semiconductor device 42 is mounted on the mounting area 437 of the substrate 43 and electrically connected to the conductive structure 433 of the substrate 43.

Figure 4B:
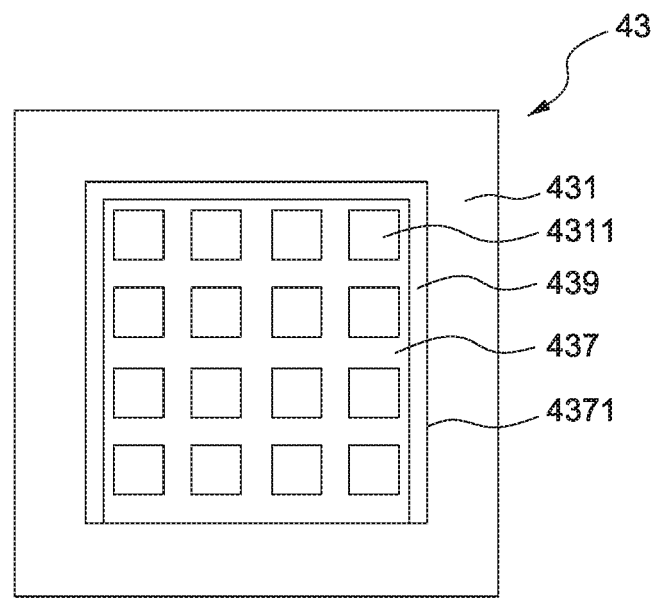
FIG. 4B is a top view of a substrate in accordance with some embodiments of the instant disclosure.

FIG. 4B is a top view of the substrate 43 in accordance with some embodiments of the instant disclosure. Referring to FIGS. 4A and 4B, a protrusion 439 is arranged on the mounting area 437 of the substrate 43, wherein the protrusion 439 is continuously formed along at least three edges 4371 of the mounting area 437 of the substrate 43. In addition, the solder pads 4311 are substantially surrounded by the protrusion 439. As shown in FIG. 4A, the protrusion 439 has an inclined top surface 4391 such that a height at the edge of the protrusion 439 proximate to the side edge 4371 of the mounting area 437 of the substrate 43 is larger than a height at the edge of the protrusion 439 distal from the side edge 4371 of the mounting area 437 of the substrate 43. Thus, the protrusion 439 has a tapered structure which is inwardly tapered away from the side edge 4371 of the mounting area 437 of the substrate 43. Further, the height at the edge of the protrusion 439 proximate to the side edge 4371 of the mounting area 437 of the substrate 43 is less than or equal to about half of the distance between the active surface 421 of the semiconductor device 42 and the upper surface 431 of the substrate 43.

Figure 4C:
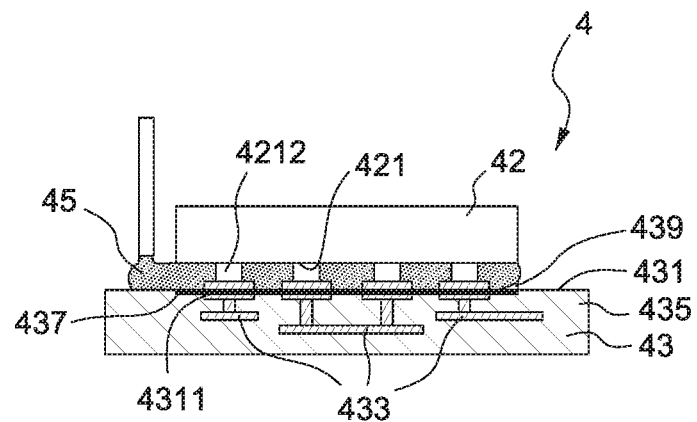
FIG. 4C is a cross-sectional view of a semiconductor device package in which a flow of an underfill is filled in accordance with some embodiments of the instant disclosure.

FIG. 4C is a cross-sectional view of the semiconductor device package 4 in which a flow of the underfill 45 is filled in accordance with some embodiments of the instant disclosure. As shown in FIG. 4C, the underfill 45 is filled between the semiconductor device 42 and the substrate 43. The underfill 45 flows into the space between the active surface 421 of the semiconductor device 42 and the mounting area 437 of the substrate 43 and then the flow of the underfill 45 will stop at the edge of the protrusion 439 proximate to the side edge 4371 of the mounting area 437 of the substrate 43. When the underfill 45 flows into the space between the active surface 421 of the semiconductor device 42 and the mounting area 437 of the substrate 43 and passes through the protrusion 439, the flow of the underfill 45 will be changed due to the tapered configuration of the protrusion 439. Further, the contact angle between the underfill 45 and the substrate 43 will be changed accordingly such that the overflow of the underfill 45 can be controlled.

Figure 5A:
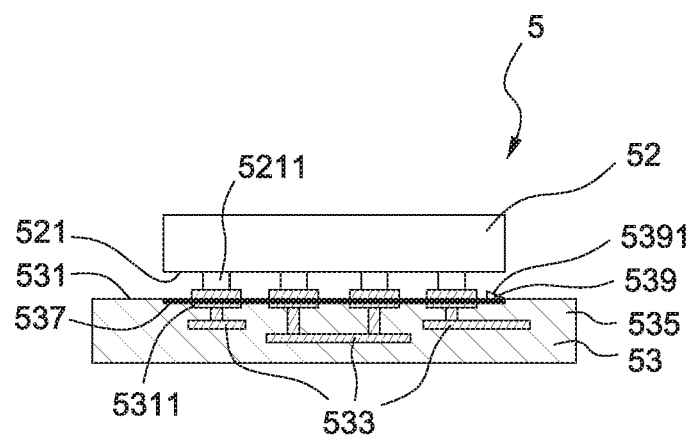
FIG. 5A is a cross-sectional view of a semiconductor device package in accordance with some embodiments of the instant disclosure, in which the underfill is not filled therein yet.

FIG. 5A is a cross-sectional view of a semiconductor device package 5 in which an underfill is not filled in accordance with some embodiments of the instant disclosure. With reference to FIG. 5A, the semiconductor package 5 includes a semiconductor device 52 and a substrate 53. The semiconductor device 52 has an active surface 521, wherein multiple solder bumps 5212 are disposed on the active surface 521 of the semiconductor device 52. The substrate 53 comprises a conductive structure 533 and a non-conductive structure 535, and the conductive structure 533 can be a conductive pattern and the non-conductive structure 535 can be a solder resist or a dielectric layer. Further, the substrate 53 has a mounting area 537 on its upper surface 531 which is facing the active surface 521 of the semiconductor device 52. Multiple solder pads 5311 are arranged on the mounting area 537 and electrically connected to the conductive structure 533 of the substrate 53. The solder bumps 5212 of the semiconductor device 52 are bonded to the solder pads 5311 of the substrate 53 by a reflow soldering process such that the semiconductor device 52 is mounted on the mounting area 537 of the substrate 53 and electrically connected to the conductive structure 533 of the substrate 53.

Figure 5B:
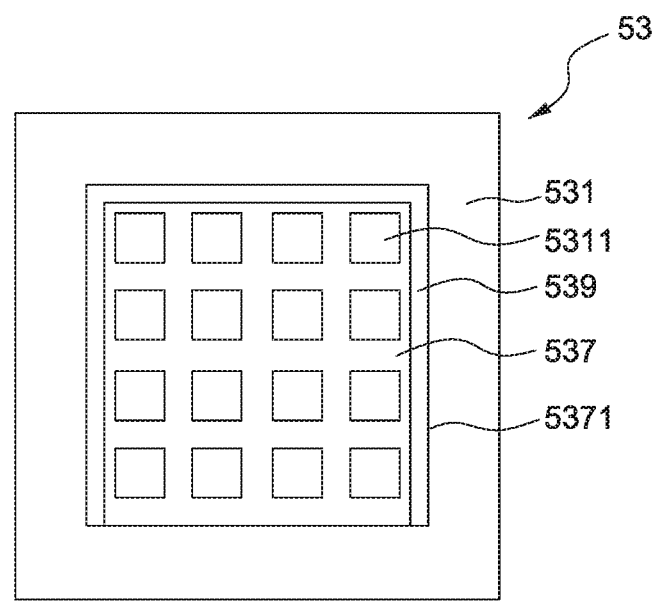
FIG. 5B is a top view of a substrate in accordance with some embodiments of the instant disclosure.

FIG. 5B is a top view of the substrate 53 in accordance with some embodiments of the instant disclosure. Referring to FIGS. 5A and 5B, a protrusion 539 is arranged on the mounting area 537 of the substrate 53, wherein the protrusion 539 is continuously formed along at least three edges 5371 of the mounting area 537 of the substrate 53. In addition, the solder pads 5311 are substantially surrounded by the protrusion 539. As shown in FIG. 5A, the protrusion 539 has an inclined top surface 5391 such that a height at the edge of the protrusion 539 proximate to the side edge 5371 of the mounting area 537 of the substrate 53 is smaller than a height at the edge of the protrusion 539 distal from the side edge 5371 of the mounting area 537 of the substrate 53. Thus, the protrusion 539 has a tapered structure which is outwardly tapered toward the side edge 5371 of the mounting area 537 of the substrate 53. Further, the height at the edge of the protrusion 539 distal from the side edge 5371 of the mounting area 537 of the substrate 53 is less than or equal to about half of the distance between the active surface 521 of the semiconductor device 52 and the upper surface 531 of the substrate 53.

Figure 5C:
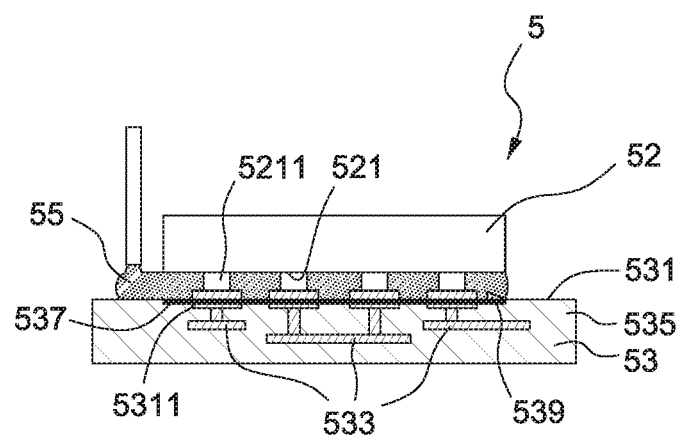
FIG. 5C is a cross-sectional view of a semiconductor device package in which a flow of an underfill is filled in accordance with some embodiments of the instant disclosure.

FIG. 5C is a cross-sectional view of a semiconductor device package 5 in which a flow of an underfill 55 is filled in accordance with some embodiments of the instant disclosure. As shown in FIG. 5C, the underfill 55 is filled between the semiconductor device 52 and the substrate 53. The underfill 55 flows into the space between the active surface 521 of the semiconductor device 52 and the mounting area 537 of the substrate 53 and then the flow of the underfill 55 will stop at the edge of the protrusion 539 proximate to the side edge 5371 of the mounting area 537 of the substrate 53. When the underfill 55 flows into the space between the active surface 521 of the semiconductor device 52 and the mounting area 537 of the substrate 53 and passes through the protrusion 539, the flow of the underfill 55 will be changed due to the tapered configuration of the protrusion 539. Further, the contact angle between the underfill 55 and the substrate 53 will be changed accordingly such that the overflow of the underfill 55 can be controlled.

Figure 6A:
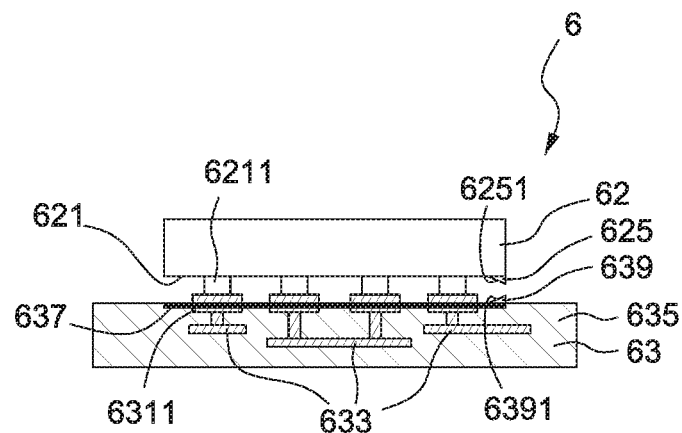
FIG. 6A is a cross-sectional view of a semiconductor device package in which an underfill is not filled in accordance with some embodiments of the instant disclosure.

FIG. 6A is a cross-sectional view of a semiconductor device package 6 in which an underfill is not filled in accordance with some embodiments of the instant disclosure. With reference to FIG. 6A, the semiconductor device package 6 includes a semiconductor device 62 and a substrate 63. The semiconductor device 62 has an active surface 621, wherein multiple solder bumps 6212 are disposed on the active surface 621 of the semiconductor device 62. The substrate 63 comprises a conductive structure 633 and a non-conductive structure 635, and the conductive structure 633 can be a conductive pattern and the non-conductive structure 635 can be a solder resist or a dielectric layer. Further, the substrate 63 has a mounting area 637 on its upper surface 631 which is facing the active surface 621 of the semiconductor device 62. Multiple solder pads 6311 are arranged on the mounting area 637 and electrically connected to the conductive structure 633 of the substrate 63. The solder bumps 6212 of the semiconductor device 62 are bonded to the solder pads 6311 of the substrate 63 by a reflow soldering process such that the semiconductor device 62 is mounted on the mounting area 637 of the substrate 63 and electrically connected to the conductive structure 633 of the substrate 63.

Figure 6B:
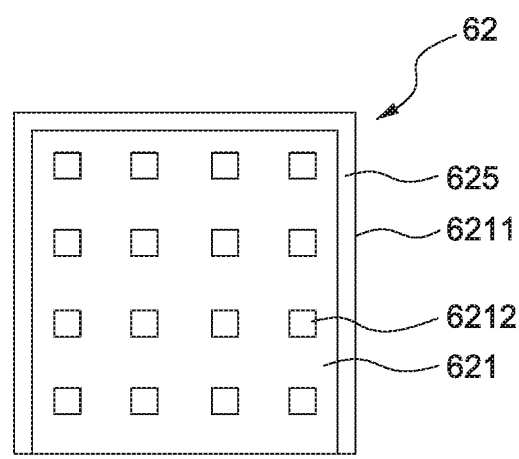
FIG. 6B is a bottom view of a semiconductor device in accordance with some embodiments of the instant disclosure.

FIG. 6B is a bottom view of the semiconductor device 62 in accordance with some embodiments of the instant disclosure. Referring to FIGS. 6A and 6B, a protrusion 625 is arranged at the active surface 621 of the semiconductor device 62, wherein the protrusion 625 is continuously formed along at least three edges 6211 of the active surface 621 of the semiconductor device 62. In addition, the solder bumps 6212 are substantially surrounded by the protrusion 625. As shown in FIG. 6A, the protrusion 625 has an inclined top surface 6251 such that a height at the edge of the protrusion 625 proximate to the side edge 6211 of the active surface 621 of the semiconductor device 62 is larger than a height at the edge of the protrusion 625 distal from the side edge 6211 of the active surface 621 of the semiconductor device 62. Thus, the protrusion 625 has a tapered structure which is tapered inwardly away from the side edge 6211 of the active surface 621 of the semiconductor device 62.

Figure 6C:
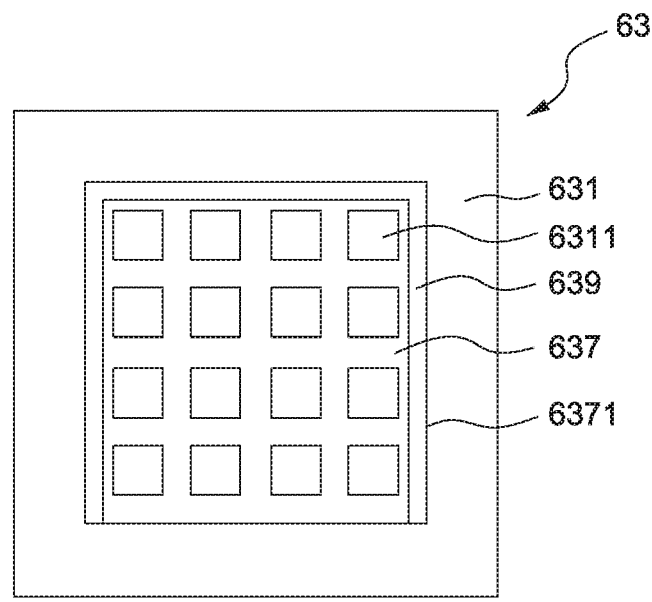
FIG. 6C is a top view of a substrate in accordance with some embodiments of the instant disclosure.

FIG. 6C is a top view of the substrate 63 in accordance with some embodiments of the instant disclosure. Referring to FIGS. 6A and 6C, a protrusion 639 is arranged on the mounting area 637 of the substrate 63, wherein the protrusion 639 is continuously formed along at least three edges 6371 of the mounting area 637 of the substrate 63. In addition, the solder pads 6311 are substantially surrounded by the protrusion 639. As shown in FIG. 6A, the protrusion 639 has an inclined top surface 6391 such that a height at the edge of the protrusion 639 proximate to the side edge 6371 of the mounting area 637 of the substrate 63 is larger than a height at the edge of the protrusion 639 distal from the side edge 6371 of the mounting area 637 of the substrate 63. Thus, the protrusion 639 has a tapered structure which is tapered inwardly away from the side edge 6371 of the mounting area 637 of the substrate 63. Further, the shortest distance between the protrusions 625 and 639 is greater than or equal to about half of the distance between the active surface 621 of the semiconductor device 62 and the upper surface 631 of the substrate 63. In some embodiments, the protrusions 625 and 639 are substantially symmetrical.

Figure 6D:
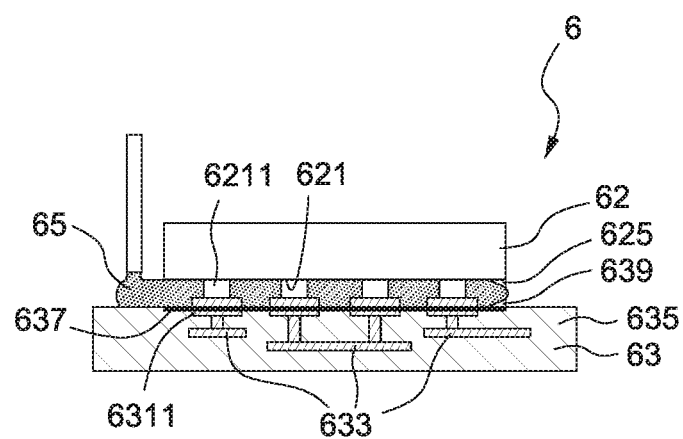
FIG. 6D is a cross-sectional view of a semiconductor device package in which a flow of an underfill is filled in accordance with some embodiments of the instant disclosure.

FIG. 6D is a cross-sectional view of the semiconductor device package 6 in which a flow of the underfill 65 is filled therein in accordance with some embodiments of the instant disclosure. As shown in FIG. 6D, the underfill 65 is filled between the semiconductor device 62 and the substrate 63. The underfill 65 flows into the space between the active surface 621 of the semiconductor device 62 and the mounting area 637 of the substrate 63 and then the flow of the underfill 65 will stop at the edge of the protrusion 625 proximate to the side edge 6211 of the active surface 621 of the semiconductor device 62 and at the edge of the protrusion 639 proximate to the side edge 6371 of the mounting area 637 of the substrate 63. When the underfill 65 flows into the space between the active surface 621 of the semiconductor device 62 and the mounting area 637 of the substrate 63 and passes through the protrusions 625 and 639, the flow of the underfill 65 will be changed due to the tapered configurations of the protrusions 625 and 639. Further, the contact angles between the underfill 65 and the semiconductor device 62 and between the underfill 65 and the substrate 63 will be changed accordingly such that overflow of the underfill 65 can be controlled.

Figure 7A:
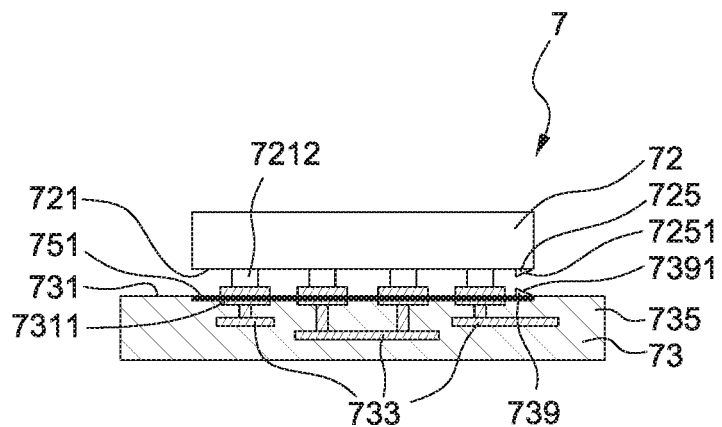
FIG. 7A is a cross-sectional view of a semiconductor device package in which an underfill is not filled in accordance with some embodiments of the instant disclosure.

FIG. 7A is a cross-sectional view of a semiconductor device package 7 in which an underfill is not filled in accordance with some embodiments of the instant disclosure. With reference to FIG. 7A, the semiconductor device package 7 includes a semiconductor device 72 and a substrate 73. The semiconductor device 72 has an active surface 721, wherein multiple solder bumps 7212 are disposed on the active surface 721 of the semiconductor device 72. The substrate 73 comprises a conductive structure 733 and a non-conductive structure 735, and the conductive structure 733 can be a conductive pattern and the non-conductive structure 735 can be a solder resist or a dielectric layer. Further, the substrate 73 has a mounting area 737 on its upper surface 731 which is facing the active surface 721 of the semiconductor device 72. Multiple solder pads 7311 are arranged on the mounting area 737 and electrically connected to the conductive structure 733 of the substrate 73. The solder bumps 7212 of the semiconductor device 72 are bonded to the solder pads 7311 of the substrate 73 by a reflow soldering process such that the semiconductor device 72 is mounted on the mounting area 737 of the substrate 73 and electrically connected to the conductive structure 733 of the substrate 73.

Figure 7B:
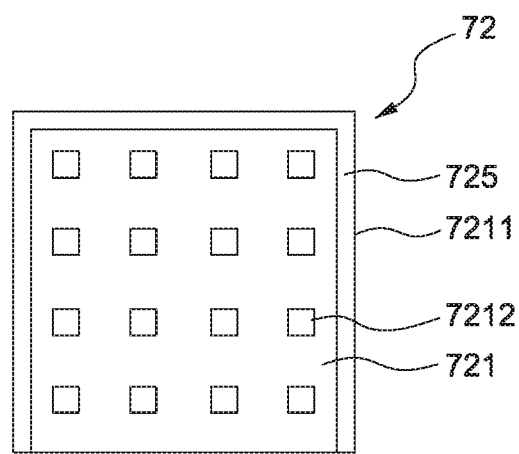
FIG. 7B is a bottom view of a semiconductor device in accordance with some embodiments of the instant disclosure.

FIG. 7B is a bottom view of the semiconductor device 72 in accordance with some embodiments of the instant disclosure. Referring to FIGS. 7A and 7B, a protrusion 725 is arranged at the active surface 721 of the semiconductor device 72, wherein the protrusion 725 is continuously formed along at least three edges 7211 of the active surface 721 of the semiconductor device 72. In addition, the solder bumps 7212 are substantially surrounded by the protrusion 725. As shown in FIG. 7A, the protrusion 725 has an inclined top surface 7251 such that a height at the edge of the protrusion 725 proximate to the side edge 7211 of the active surface 721 of the semiconductor device 72 is less than a height at the edge of the protrusion 725 distal from the side edge 7211 of the active surface 721 of the semiconductor device 72. Thus, the protrusion 725 has a tapered structure which is outwardly tapered toward the side edge 7211 of the active surface 721 of the semiconductor device 72.

Figure 7C:
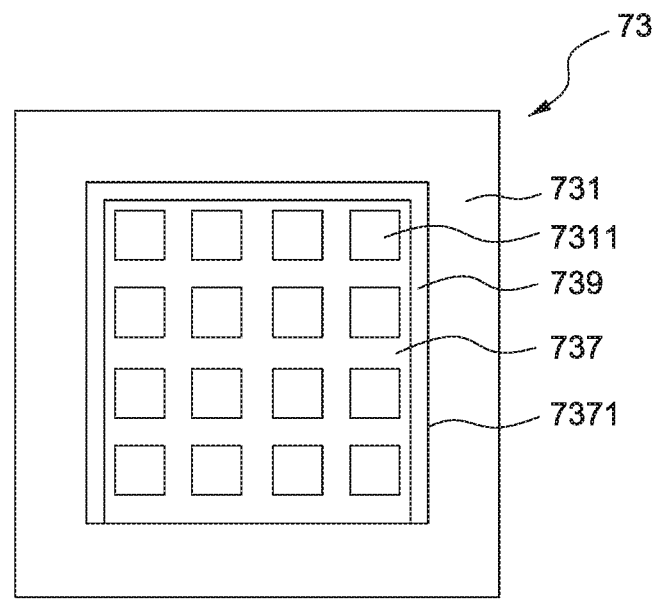
FIG. 7C is a top view of a substrate in accordance with some embodiments of the instant disclosure.

FIG. 7C is a top view of the substrate 73 in accordance with some embodiments of the instant disclosure. Referring to FIGS. 7A and 7C, a protrusion 739 is arranged on the mounting area 737 of the substrate 73, wherein the protrusion 739 is continuously formed along at least three edges 7371 of the mounting area 737 of the substrate 73. In addition, the solder pads 7311 are substantially surrounded by the protrusion 739. As shown in FIG. 7A, the protrusion 739 has an inclined top surface 7391 such that a height at the edge of the protrusion 739 proximate to the side edge 7371 of the mounting area 737 of the substrate 73 is less than a height at the edge of the protrusion 739 distal from the side edge 7371 of the mounting area 737 of the substrate 73. Thus, the protrusion 739 has a tapered structure which is outwardly tapered toward the side edge 7371 of the mounting area 737 of the substrate 73. Further, the shortest distance between the protrusions 725 and 739 is greater than or equal to about half of the distance between the active surface 721 of the semiconductor device 72 and the upper surface 731 of the substrate 73. In some embodiments, the protrusions 725 and 739 are substantially symmetrical.

Figure 7D:
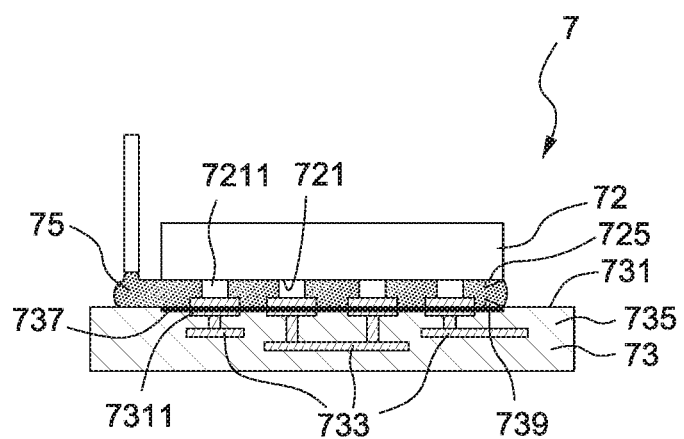
FIG. 7D is a cross-sectional view of a semiconductor device package in which a flow of an underfill is filled in accordance with some embodiments of the instant disclosure.

FIG. 7D is a cross-sectional view of the semiconductor device package 7 in which a flow of an underfill 75 is filled therein in accordance with some embodiments of the instant disclosure. As shown in FIG. 7D, the underfill 75 is filled between the semiconductor device 72 and the substrate 73. The underfill 75 flows into the space between the active surface 721 of the semiconductor device 72 and the mounting area 737 of the substrate 73 and then the flow of the underfill 75 will stop at the edge of the protrusion 725 proximate to the side edge 7211 of the active surface 721 of the semiconductor device 72 and at the edge of the protrusion 739 proximate to the side edge 7371 of the mounting area 737 of the substrate 73. When the underfill 75 flows into the space between the active surface 721 of the semiconductor device 72 and the mounting area 737 of the substrate 73 and passes through the protrusions 725 and 739, the flow of the underfill 75 will be changed due to the tapered configurations of the protrusions 725 and 739. Further, the contact angles between the underfill 75 and the semiconductor device 72 and between the underfill 75 and the substrate 73 will be changed accordingly such that overflow of the underfill 75 can be controlled.

The above embodiments describe the principle and effects of the present disclosure, instead of being used to limit the present disclosure. Therefore, persons skilled in the art can make modifications and variations to the above embodiments without departing from the spirit of the present disclosure. The scope of the present disclosure should be defined by the appended claims.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be coplanar or aligned if a displacement between the two surfaces is no greater than 0.5 µm, no greater than 1 µm, no greater than 5 µm, no greater than 10 µm, or no greater than 15 µm. In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
a substrate having a surface and comprising a first protrusion disposed on the surface of the substrate, and the first protrusion continuously formed along at least three edges of the surface of the substrate;
a semiconductor device disposed on the surface of the substrate and having a surface facing the surface of the substrate;
an underfill forming between the surface of the semiconductor device and the surface of the substrate; and
a second protrusion on the surface of the semiconductor device;
wherein the first protrusion is within a vertical projection of the semiconductor device on the surface of the substrate, and the first protrusion has a tapered structure.

2. The semiconductor device package of claim 1, wherein a height of the first protrusion is less than or equal to half of a distance between the surface of the substrate and the surface of the semiconductor device.

3. The semiconductor device package of claim 1, further a mounting area on the surface of the substrate, wherein the first protrusion is disposed on the mounting area.

4. The semiconductor device package of claim 3, wherein the first protrusion has an inclined top surface such that a height at the edge of the first protrusion proximate to a side edge of the mounting area is larger than a height at the edge of the first protrusion distal from the side edge of the mounting area.

5. The semiconductor device package of claim 4, wherein the height at the edge of the first protrusion proximate to the side edge of the mounting area is less than or equal to half of a distance between the surface of the semiconductor device and the surface of the substrate.

6. The semiconductor device package of claim 3, wherein the first protrusion is inwardly tapered from a side edge of the mounting area of the substrate.

7. The semiconductor device package of claim 3, wherein the first protrusion is outwardly tapered toward a side edge of the mounting area.

8. The semiconductor device package of claim 1, wherein the first protrusion and the second protrusion are substantially symmetrical.

9. The semiconductor device package of claim 1, wherein a shortest distance between the first and second protrusions is greater than or equal to half of a distance between the surface of the semiconductor device and the surface of the substrate.

10. The semiconductor device package of claim 1, further comprising a plurality of bumps surrounded by the first protrusion.

11. A semiconductor device package, comprising:
a substrate having a surface and comprising a first protrusion disposed on the surface of the substrate,
a semiconductor device disposed on the surface of the substrate and having a surface facing the surface of the substrate;
an underfill forming between the surface of the semiconductor device and the surface of the substrate; and
a second protrusion on the surface of the semiconductor device;
wherein the surface of the substrate has a mounting area underneath the semiconductor device and corresponding to the surface of the semiconductor device, and wherein the first protrusion has a tapered structure and the first protrusion is arranged within the mounting area and continuously formed along at least three edges of the mounting area, and wherein the at least three edges of the mounting area align with three side surfaces of the semiconductor device respectively.

12. The semiconductor device package of claim 11, wherein a height of the first protrusion is less than or equal to half of a distance between the surface of the substrate and the surface of the semiconductor device.

13. The semiconductor device package of claim 11, wherein the first protrusion has an inclined top surface such that a height at the edge of the first protrusion proximate to a side edge of the mounting area is larger than a height at the edge of the first protrusion distal from the side edge of the mounting area.

14. The semiconductor device package of claim 13, wherein the height at the edge of the first protrusion proximate to the side edge of the mounting area is less than or equal to half of a distance between the surface of the semiconductor device and the surface of the substrate.

15. The semiconductor device package of claim 11, wherein the first protrusion has an inclined top surface such that a height at the edge of the first protrusion proximate to the side edge of the mounting area is smaller than a height at the edge of the first protrusion distal from the side edge of the mounting area.

16. The semiconductor device package of claim 15, wherein the height at the edge of the first protrusion distal from the side edge of the mounting area is less than or equal to about half of the distance between the surface of the semiconductor device and the surface of the substrate.

17. The semiconductor device package of claim 11, wherein the first protrusion and the second protrusion are substantially symmetrical.

18. The semiconductor device package of claim 11, wherein a shortest distance between the first and second protrusions is greater than or equal to half of a distance between the surface of the semiconductor device and the surface of the substrate.

* * * * *